United States Patent [19]

Kaplinsky

[11] Patent Number: 5,298,866
[45] Date of Patent: Mar. 29, 1994

[54] CLOCK DISTRIBUTION CIRCUIT WITH ACTIVE DE-SKEWING

[76] Inventor: Cecil H. Kaplinsky, 140 Melville Ave., Palo Alto, Calif. 94301

[21] Appl. No.: 893,450

[22] Filed: Jun. 4, 1992

[51] Int. Cl.$^5$ .......................................... G01R 25/04
[52] U.S. Cl. ................................. 328/155; 307/527; 328/133; 328/55
[58] Field of Search ............... 307/262, 269, 602, 603, 307/595, 606, 263, 527; 328/155, 55, 133

[56] References Cited

U.S. PATENT DOCUMENTS

| | | | |
|---|---|---|---|
| 4,755,704 | 6/1988 | Flora et al. | 307/606 |
| 4,868,522 | 9/1989 | Popat et al. | 331/2 |
| 4,899,071 | 2/1990 | Morales . | |
| 5,103,192 | 4/1992 | Sekine et al. | 328/155 |
| 5,118,975 | 6/1992 | Hillis et al. | 328/155 |
| 5,124,569 | 6/1992 | Phillips | 328/155 |
| 5,164,677 | 11/1992 | Hawkins et al. | 307/603 |
| 5,221,863 | 6/1993 | Motegi | 307/603 |

OTHER PUBLICATIONS

Johnson, Mark G. and Hudson, Edwin L., "A Variable Delay Line PLL for CPU-Coprocessor Synchronization", *IEE Journal of Solid-State Circuits*, vol. 23, No. 5, Oct. 1988, pp. 1218-1219.

Primary Examiner—William L. Sikes
Assistant Examiner—Shawn Riley
Attorney, Agent, or Firm—Schneck & McHugh

[57] ABSTRACT

A clock distribution circuit with multiple clock drivers distributing a clock signal on multiple signal paths has active de-skewing logic circuitry for equalizing the total clock delay to the different clock recipient circuits in a system. The de-skewing logic uses a return path parallel to the outward signal path to sense the propagation delay and includes a phase comparator with inputs receiving the return signal and a reference signal for comparison of their phase. Voltage-controlled delay elements, responsive to a control voltage provided by a charge pump controlled by the phase comparator, adds or removes equal amounts of delay to the outward and return signal paths until the return signal phase matches that of the reference signal. Each clock driver may have its own de-skewing circuitry or may share a common reference signal. In one embodiment the de-skewing circuitry for each driver time-shares a common phase comparator and charge pump, using sample-and-hold circuits to store the control voltages obtained by the comparisons. Input receivers on the return paths may have selectable input buffers to take into account the different buffer delays of different logic family types of the clock recipients.

10 Claims, 4 Drawing Sheets

CLOCK DISTRIBUTION CIRCUIT WITH ACTIVE DE-SKEWING

TECHNICAL FIELD

The present invention relates to clock distribution circuits, that is, to integrated circuits that receive or generate one or more clock signals, then distribute the signal or signals to other circuit elements in a system.

BACKGROUND ART

Accurate timing for a system is provided by clocks. To fulfill the need to send multiple clock signals to the various circuit elements in a system, clock distribution chips are provided. Such chips are capable of distributing a clock signal across a printed circuit board of a system or among several printed circuit boards. Typical clock distribution chips include at least one clock input terminal for receiving an external "reference" clock signal. Alternatively, some or all of the clock signals may be generated by the chip itself. Typically, the received or generated clock signal is then split into multiple clock signals on separate signal paths for receipt by the chip's several clock drivers. The drivers distribute these multiple clock signals as outputs through multiple clock output terminals. The clock signals then propagate over wire traces across the printed circuit board to the recipient circuit elements or chips in the system.

Clock distribution chips are used especially in high speed systems, where accurate timing is essential to avoid conflicts on system busses that are used by several circuit elements of these systems, and also to minimize as much as possible various circuit elements having to wait unduly long time periods for other circuit elements to complete their operations before beginning the next operation in a sequence of successive program instructions. As systems get faster, and hence use shorter clock cycles, "relativistic" effects become important. Note that the time at any particular location in the system, such as at a circuit element or chip of the system, is observed as a phase of a clock signal received at that location. Because of different clock delays, the time observed at one location in the system may not be the same as the time observed at another location. The relative offset in the observed time or clock phase at different locations in the system due to clock delays is called "clock skew". As clock speeds become greater than 50 MHz, the corresponding clock cycle or period becomes less than 20 ns, and any clock skew becomes a significant portion of this clock period.

Clock delays are caused by several factors. First, it takes time for a clock signal to travel down a wire trace or other signal path to its destination, because the propagation speed is finite. A propagation delay of one nanosecond for every 15 to 18 centimeters of unloaded wire trace is typical. Skew can result if the wire trace lengths to the various circuit elements differ substantially from one another. To minimize this skew, system designers typically place the clock chip in a central location that minimizes as much as possible the variation in the propagation distances from the clock distribution chip to the receiving circuit elements in the system. Second, clock delays may be caused by the fanout on the clock distribution chip from a single received or generated reference clock signal to multiple clock signal outputs. Typical fanout delays are 2 nanoseconds for a fanout of four, doubling to 4 nanoseconds for a fanout of eight. If multiple clock distribution chips are needed, all should have the same fanout to avoid skew from this source of clock delay. Skew can also result if the multiple clock drivers on the clock distribution chip are not exactly matched. Due to manufacturing tolerances there is an intrinsic pin-to-pin skew among the chip's different clock outputs of about 0.5 to 1.0 nanoseconds for identical loads. Third, clock delays are caused by the loads on each of the clock signal paths. The clock drivers take different amounts of time to charge up the different RC loads on the various signal paths. The speed of propagation of a signal across a board $tpd' = tpd \sqrt{1+(C_d/C_o)}$, where tpd is the signal delay per unit length for an unloaded trace, $C_d$ is the distributed capacitance of the load (typically about 0.8–1.6 pF/cm), and $C_o$ is the intrinsic capacitance of the trace (typically about 0.8 pF/cm). The load will typically increase the clock delay by anywhere from 40% to 70% over the delay on an unloaded trace. Significant clock skew will result if the loads provided by the recipient circuit elements are not substantially identical. Typically, a circuit designer will use clock distribution chips with low intrinsic inter-driver skew and try to equalize the loads on the various signal paths. Skew can also result from different input threshold levels of the input buffers of the various recipient circuit elements or chips, because of the finite rise time of the clock signal. For example, the difference between a 1.5 V threshold for a TTL chip and a 2.5 V for a CMOS chip can cause a 1 ns clock skew between these two circuit types.

After taking all of these factors into account, the typical clock skew $T_{skew}$ in a well designed system is about 2 or 3 nanoseconds. This is dead time and forces the designer to design the system to tolerances of $T_{period} - T_{skew}$, where $T_{period}$ is period of the clock signal. In a 50 MHz system with a 20 ns clock period, a 3 ns skew means that 15% of the clock cycle is wasted. In faster systems, an even greater portion of the clock cycle will be wasted meeting system tolerance requirements due to the skew. Depending on the nature of the particular system, a one nanosecond clock skew may be intolerable, even at 50 MHz speeds.

It is known to use phase-locked-loop-like techniques and a reference clock to dynamically adjust the delays on other non-clock signal paths. In U.S. Pat. No. 4,899,071, Morales describes an active digital delay line circuit having two or more arrays of series-connected voltage-controlled delay elements. A reference clock and a delayed reference clock, formed by passing the reference clock through one of the arrays, are compared by a phase detector, which outputs a control voltage representation of the signal delay. This control voltage is applied to control inputs of the delay elements in each array. Thus, Morales uses a phase-locked loop to correlate on-silicon delays with the reference clock period, and then uses that result to generate or produce desired time delays of input signals received by the delay circuit.

It is an object of the invention to provide a clock distribution chip that results in reduced clock skew in systems using this chip.

DISCLOSURE OF THE INVENTION

The above object has been met with a clock distribution circuit having de-skewing logic at the clock outputs, which senses and measures the clock delay on each signal path and then adjusts the phase of the outgoing clock signals, so that all of the clock signals arrive at their respective destinations, i.e., at the clock recipient circuits, with substantially the same phase. The clock distribution circuit dynamically adjusts the delays on each signal path using techniques similar to phase-locked loops, so that any skew between signal paths due to differences in clock delays from any cause is significantly reduced. Thus, by moving the delays that are already there, the clock distribution circuit de-skews the clock signal so that the times observed by the different clock recipients are effectively the same.

The clock distribution circuit of the present invention, like prior circuits, has multiple clock drivers that take a clock signal and distribute it on different signal paths to the various clock recipients. In order to measure the clock delay on each path it is necessary to bring the signal back and see when it arrives back in the chip. Accordingly, the present invention requires that circuit designers provide return paths for the clock signal. The conductive trace of each return path should be placed close to and parallel with the conductive trace of the corresponding outward signal path so that the return path is nearly identical in length to the corresponding outward signal path. This ensures that the propagation time for the clock signal going from the clock chip out to the load is substantially the same as the propagation time for the return signal coming from the load back to the clock chip.

The de-skewing logic includes a phase comparator within the clock chip that samples a return signal and compares its phase to the phase of a reference signal. For each clock output driver sending a clock signal to a clock recipient, there are two identical voltage-controlled delay elements within the clock chip, one on the outward signal path and the other on the return path. Each pair of delay elements is responsive to a control voltage resulting from the phase comparison so as to adjust the amount of delay on the outward and return signal paths until the phase of the return signal matches the phase of the reference signal. For example, if the return signal lags the reference signal, the phase comparator will output a signal that causes the control voltage to be decreased, reducing the amount of delay provided by the pair of controllable delay elements. Both delay elements in each pair respond to the same control voltage so that half of the delay is on the outward signal path to the clock recipient and half of the delay is on the return path back to the clock chip. Once the paths corresponding to all of the clock output drivers have been adjusted in this way, the clock signal will have little skew from one signal path to the next.

Each output driver may have its own separate de-skewing logic, including not only a separate pair of delay elements, but also a separate phase comparator and a separately generated reference signal. However, all of the reference signals for all of the drivers must be produced in an identical manner from the same clock input to be distributed by the drivers, in order to have substantially matching phases. Alternatively, the de-skewing logic for several or all output drivers may share a single reference signal in common. Further, multiple outputs can even time-share the phase comparator and the associated charge pump used to increase or decrease the control voltage. By means of a multiplexer, one output driver is selected, the chip finds the correct control voltage for delaying the corresponding clock and return signals for that driver, stores this control voltage in a sample-and-hold circuit, and moves on to the next output driver. Once the correct delays are found for all drivers, the control voltage in the corresponding sample-and-hold circuits need only be refreshed periodically. The clock chip's input receiver on the signal return path may have several types of input buffers, such as TTL and CMOS buffers, selectable by a programmable switch to designate a particular threshold switching voltage for the transition between low and high logic levels, thereby enabling the skew caused by different types of circuits in the system to be substantially eliminated. The clock distribution chips may provide additional phase-shifted clocks to the system that are related, for example, by one-quarter and one-half of a clock period to another distributed clock signal. Each of the drivers for the phase-shifted clocks also has de-skewing logic, but with separate reference signals generated from the phase-shifted clock signals. The one-half period shifted signal might, alternatively, use an inverted version of the common reference signal. A reset hold circuit may intercept the system reset signal and send out another reset signal to the circuit elements or chips of the system that prevents normal operation of the system until the delays on all clock paths distributed by the clock distribution circuit have been adjusted.

BEST MODE OF CARRYING OUT THE INVENTION

Figure 1:
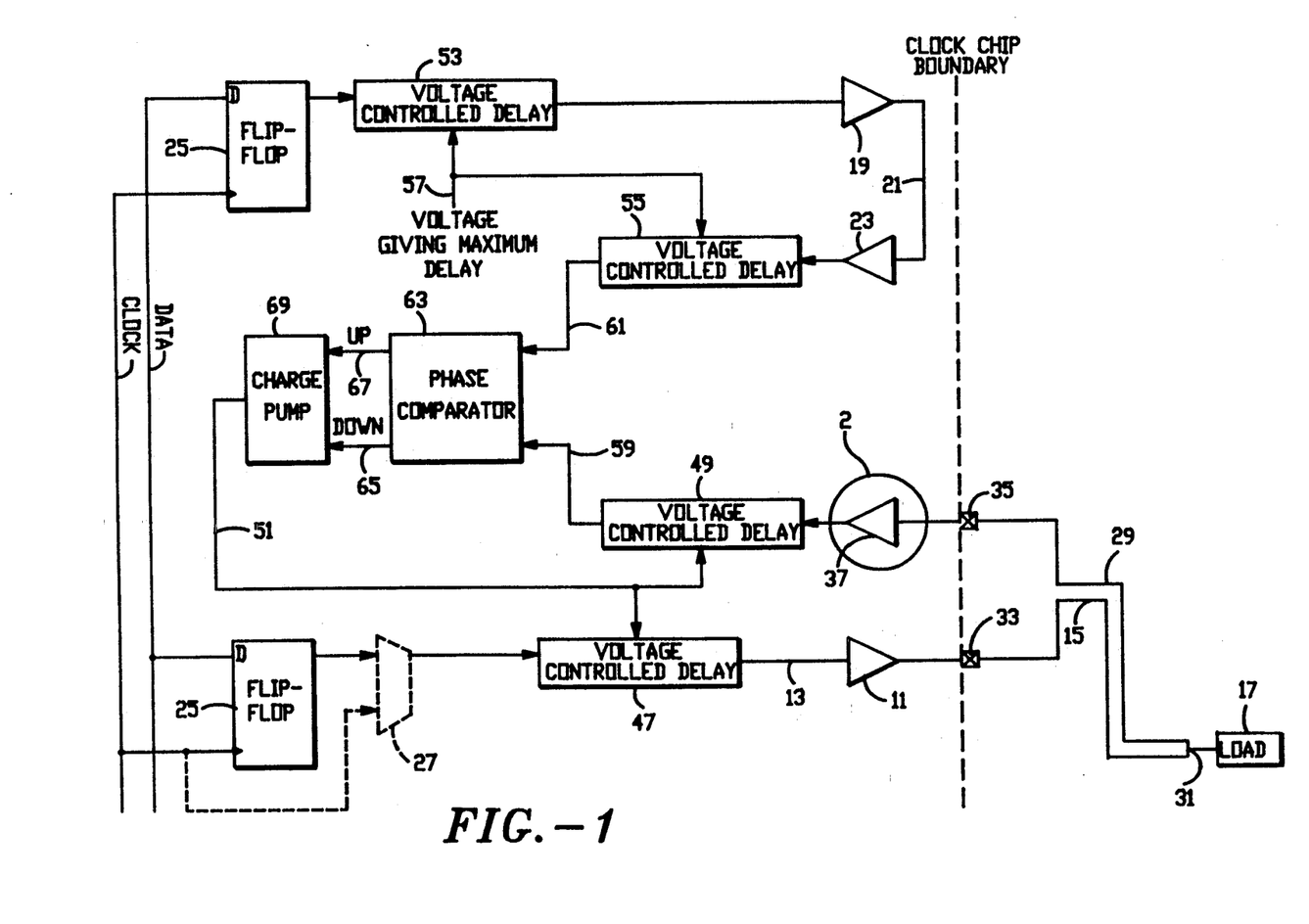
FIG. 1 is a schematic functional block diagram of a portion of a clock distribution circuit of the present invention corresponding to a single clock output driver.

With reference to FIG. 1, a clock distribution chip of the present invention has a plurality of output drivers 11, only one of which is seen in the portion illustrated in FIG. 1. Each output driver 11 is connected to receive a clock signal on its input 13 and to transmit the clock signal on a conductive wire trace 15, representing an outward signal path, to a clock recipient or load 17. Collectively, the output drivers 11 distribute multiple copies of a clock signal on a plurality of signal paths. One other clock driver 19, constructed like the output drivers 11, is part of the de-skewing circuitry that is characteristic of the present invention, and is used as a dummy output to transmit a reference clock signal. Preferably, this reference clock signal is not actually output from the chip, but rather remains entirely within the chip on a short conductive connection line 21 leading to a dummy input buffer 23.

The clock signal (CLOCK) which is distributed by the chip may be either received at a clock input terminal or generated by the chip itself using any well-known clock generating circuit. Flip-flops 25 may be placed in the clock signal paths to generate individual signal pulses for use by the de-skewing circuitry. The logic state of the DATA signal is latched into all of the flip-flops 25 simultaneously on the rising (or falling) edge of the input clock signal and stored for a single clock cycle until the arrival of the next rising (or falling) clock edge. Pulses in the DATA signal that overlap the rising (or falling) clock edge appear as one clock cycle length signal pulses that are transmitted by output drivers 11 onto outward signal traces 15. Clock distribution circuits that include these flip-flops 25 are especially useful where the greatest expected skew in a system approaches or exceeds one clock cycle. Otherwise, ordinary periodic clock signals may be used. A DATA signal having a period of twice the period of the input clock signal will cause the flip-flops 25 to output a periodic signal with the same period as the DATA signal. Alternatively, the input clock signal CLOCK can be used directly, bypassing the flip-flops 25. In any case, once the signal paths have been de-skewed, the clock distribution chip distributes periodic clock signals to the plural clock recipients 17 of the system, using either a periodic DATA signal or the input clock signal CLOCK directly. Bypassing of the flip-flops 25 may be accomplished with multiplexers 27 connected to the output of flip-flops 25 for receiving signal pulses and connected to the clock input of the flip-flops 25 for receiving the input clock signal.

In order to sense and measure the clock delay on each signal path 15 leading to a clock recipient or load 17, return paths 29 are provided. Return paths 29 are conductive wire traces laid down on the circuit board or boards parallel to and in close proximity to the outgoing clock signal path 15. The signal paths 15 and 29 connect at a node 31 just prior to reaching the load 17 itself, that is, within about a centimeter from the clock recipient's input terminal. The signal paths 15 and 29 may diverge slightly at the separate input and output terminals 33 and 35 of the clock chip. The overall lengths of the respective signal paths should be nearly identical, such that the outbound propagation time for the clock signal on signal path 15 is within 0.1 ns of the inbound propagation time for the return signal on signal path 29.

Figure 2:
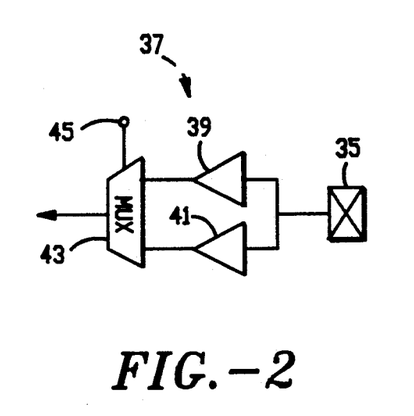
FIG. 2 is a schematic functional block diagram of the input receiver in circle 2 in the clock distribution circuit of FIG. 1 having selectable input buffers.

The return signal on return signal path 29 is received through an input terminal 35 by an input receiver 37 of the clock chip. As seen in FIG. 2, the input receiver 37 may have two or more input buffers 39 and 41, each connected to the input terminal 35. A multiplexer 43 connected to the output of each buffer 39 and 41 may be programmed, such as with a configuration memory bit 45 (an EPROM, EEPROM, etc.), to select one of the buffer outputs to be transmitted to the de-skewing logic of the clock chip. The total delay of a clock signal includes the delay in the input buffer of the clock recipient circuit 17 at the clock signal's destination. This delay cannot be measured directly, but instead is added to the delay in the return signal by the selected input buffer 39 or 41. Depending on whether the clock recipient's receiving circuit is TTL or CMOS type logic, the clock signal goes through a different transition point, 1.5 V for TTL and 2.5 V for CMOS, between the high and low logic levels. Since the clock signal typically has a rise time of about 2 ns on the conductive trace, the transition occurs at a time T for 1.5 V or TTL logic and at a time $T+\Delta$ for 2.5 V or CMOS logic. $\Delta$ is a skew of about 0.4 ns between the two types of logic circuit. The multiplexer 43 selects the buffer 39 or 41, representing the CMOS and TTL logic types, that corresponds to logic type of the clock recipient 17 so that the skew resulting from variant logic types in the same system will be taken into account by the de-skewing logic and compensated.

The clock chip includes pairs of voltage controlled delay elements 47 and 49, one pair for each output driver 11 and corresponding input receiver 37. One delay element 47 is connected to the output of the flip-flop 25 associated with a particular output driver 11 to receive signal pulses or periodic clock pulses therefrom. Alternatively, it may be connected to the output of a multiplexer 27 to receive either the output from flip-flop 25 or the input clock signal directly, as selected by the multiplexer 27. The output of delay element 47 is connected to the input 13 of output driver 11. The second delay element 49 in the pair is located on the return signal path and is connected to the output of the input receiver 37, that is, to the output of multiplexer 43 in FIG. 2. Both delay elements 47 and 49 have control inputs that receive a common control voltage on a control line 51. The amount of delay provided by the delay elements 47 and 49 depends on the received control voltage. Both delay elements 47 and 49 in the pair are substantially identical and receive an identical control voltage, and so, provide substantially equal amounts of delay to the outgoing clock signal and the incoming return signal.

The reference signal used as a basis in measuring the delay on signal paths 15 is derived from a flip-flop 25 from an input clock signal and a DATA signal in the same manner as that used to generate the signal pulse or periodic clock for output by drivers 11. The reference signal may be a clock signal or signal pulse driven by a clock driver 19, just like the other clock signals that are output from the clock chip onto conductive traces 15, with the exception that the outward and return signal paths for the reference signal are dummy paths 21 in which there are no external conductive traces connected to these paths and the reference signal never leaves the clock chip. Instead, the reference signal may be delayed by a pair of voltage-controlled delay elements 53 and 55 receiving a constant control voltage set to cause a maximum delay in the signal.

A phase comparator 63 has a pair of inputs 59 and 61, respectively connected to the outputs of delay elements 49 and 55 to receive the return signal and the reference signal therefrom. The phase comparator 63 also has a pair of outputs 65 and 67 that are connected to a corresponding pair of inputs of a charge pump 69. The charge pump 69 has an output 51 connected to the control inputs of delay elements 47 and 49. When the delay on signal paths 15 and 29 is small, the return signal on comparator input 59 leads the reference signal on input 61. The comparator 63, sensing this relative phase condition, produces a digital output signal in which the "up" output 67 is a logic 1 and the "down" output 65 is a logic 0. The charge pump 69 increases the control voltage output on line 51, thereby causing the delay elements 47 and 49 to increase the delay on the signal paths. When the delay on signal paths 15 and 29 is large, the return signal lags the reference signal. The comparator 63 senses this relative phase condition on its inputs 59 and 61 and produces a digital output signal in which the "up" output 67 is a logic 0 and the "down" output 65 is a logic 1. The charge pump 69 then decreases the control voltage on line 51, causing delay elements 47 and 49 to decrease the delay on the signal paths. When the phase condition on comparator inputs 59 and 61 is the same, the comparator 63 may output logic 0's on both outputs 65 and 67 so that the control voltage and signal delay remains unchanged.

The de-skewing logic shown in FIG. 1 may be identical for each of the many output drivers in the clock distribution circuit. Alternatively, that portion of the de-skewing circuitry containing the reference signal generating logic and that portion containing the phase comparator and charge pump may be shared among several clock output drivers, with only the delay elements, output drivers and input buffers being repeated.

Figure 3:
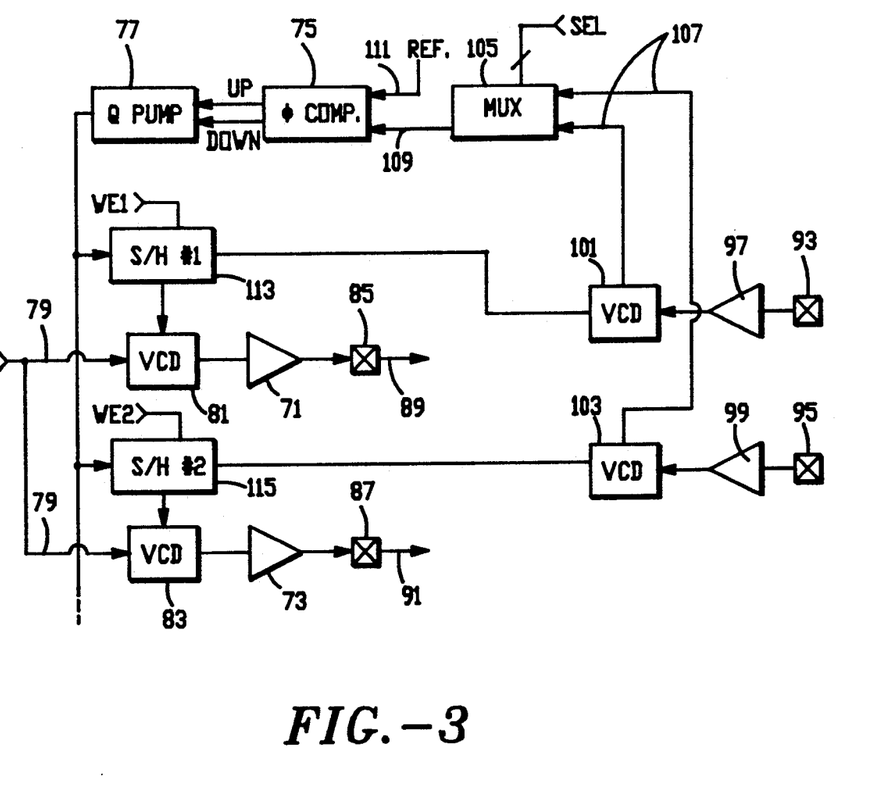
FIG. 3 is a schematic functional block diagram of a portion of a clock distribution circuit of the present invention corresponding to two clock output drivers time-sharing a single phase comparator.

In FIG. 3, a portion of a clock distribution chip shows two output drivers 71 and 73 sharing a common phase comparator 75 and its associated charge pump 77. Each clock output driver 71 and 73 receives a clock signal to be distributed on clock lines 79 via respective voltage controlled delay elements 81 and 83, and transmits the clock signal through terminals 85 and 87 over outward signal paths 89 and 91. Return signals are received through input terminals 93 and 95 by respective input receivers 97 and 99, and are transmitted through respective voltage controlled delay elements 101 and 103 to a multiplexer 105. The multiplexer 105 has signal inputs 107 for receiving the return signals corresponding to each output driver 71 and 73. Responsive to a selection signal SEL or a set of such signals, the multiplexer 105 selects one of the signal inputs 107 for transmission to the phase comparator 75. The phase comparator 75 receives the selected return signal on an input 109 and a reference signal REF on an input 111, and compares the phase of the two signals. Depending on which of the two signals leads the other, the phase comparator 75 causes, through the digital "UP" and "DOWN" outputs, the charge pump 77 to either increase or decrease its output voltage until the phases of the return signal and reference signal have the same phase. Each output driver 71 and 73 has a sample-and-hold circuit, 113 and 115 respectively, associated with it. Each sample-and-hold circuit 113 and 115 is connected to the output of the charge pump 77 to receive the control voltage therefrom. Responsive to a first write enable signal WE1, the first sample-and-hold circuit 113 loads and stores the control voltage it receives from the charge pump 77. The first write enable signal WE1 is only activated when the return signal received through first input terminal 93 by first input receiver 97 associated with the first output driver 71 has been selected by the multiplexer 105. Likewise, responsive to a second write enable WE2, the second sample-and-hold circuit 115 loads and stores the control voltage it receives from the charge pump 77. The second write enable signal WE2 is only active when the return signal associated with the second output driver 73 and received by the corresponding second input receiver 99 is selected by the multiplexer 105. Thus, each sample-and-hold circuit 113 and 115 stores a control voltage that provides the proper amount of delay on the corresponding signal path 89 and 91. Each sample-and-hold circuit 113 and 115 provides this control voltage to both voltage controlled delay elements, 81 and 101, and 83 and 103, in the pair of delay elements corresponding to the respective output driver 71 and 73.

Figure 4:
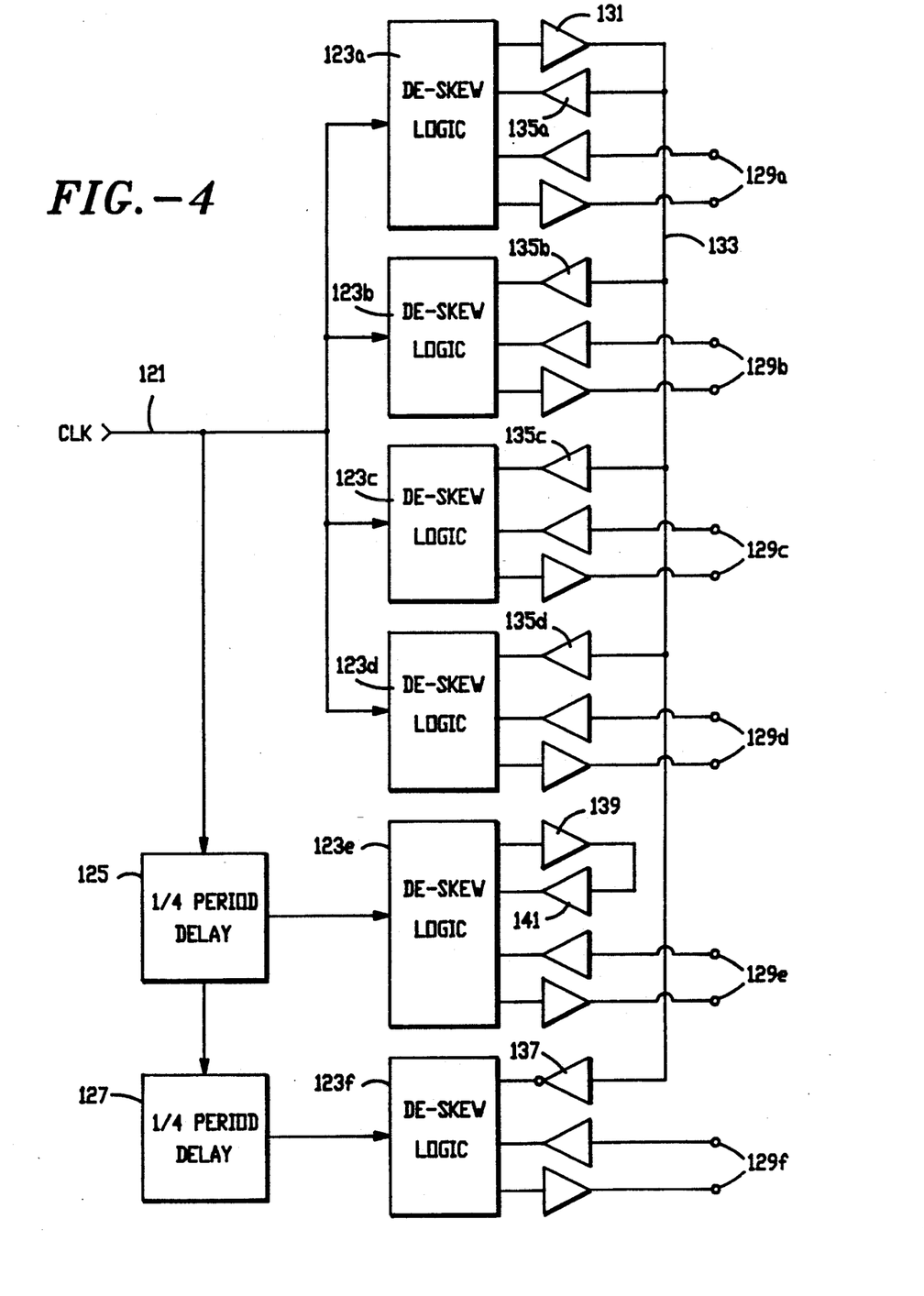
FIG. 4 is a schematic functional block diagram of a clock distribution chip of the present invention having phase-related clocks and having multiple clock drivers sharing a common reference signal.

With reference to FIG. 4, the de-skewing logic for several or all output drivers may share a single reference signal in common, even when each de-skewing circuit has its own phase comparator. A clock signal CLK on an input clock line 121 is split into several clock signals, here six in number, and pass through respective de-skewing logic circuits 123 a-f. The four clock signals corresponding to de-skewing circuitry 123 a-d are identical to one another in amplitude, period and phase, while two clock signals leading to de-skewing circuits 123e and 123f first pass through one or two one-quarter period delay elements 125 and 127, and thus are phase shifted by respective one-quarter and one-half periods relative to the clock signals leading to de-skewing logic 123a-d. The clock signals are distributed to the various clock recipients and return signals are sent back to the clock chip via associated outward and return signal paths 129 a-f, each outward signal path having an output driver transmitting the clock signal through an output terminal over a conductive wire trace and each return path having an input receiver with a selected buffer receiving the return signal through a parallel trace through an input terminal.

Each de-skewing logic circuit 123a-f is identical to that shown in FIG. 1 in having a pair of voltage controlled delay elements, a phase comparator and a charge pump, with the exception that only de-skew circuits 123a and 123e have reference signal generating circuit elements 25, 53 and 57. A reference clock driver 131 sends the reference clock signal over an on-chip conductive line 133 to input buffers 135a-d for use by the de-skewing logic 123a-d. For the one-quarter period delayed clock signal to be sent onto signal paths 129e, a separate reference signal generating circuit with a separate reference clock driver 139 and input buffer 141 is used, so that the reference signal can also be delayed by one-quarter period. For the one-half period clock signal to be sent on signal paths 129f, the reference signal must be delayed by one-half period. This can either be done separately, as with the one-quarter period delayed clock signal, or an input buffer 137 receiving the reference clock signal on line 133 may be an inverter that inverts the clock. Inverting the reference clock is equivalent to a one-half period delay. The operation of the chip's de-skewing logic circuitry 123a-f is the same as that described for FIG. 1.

Figure 5:
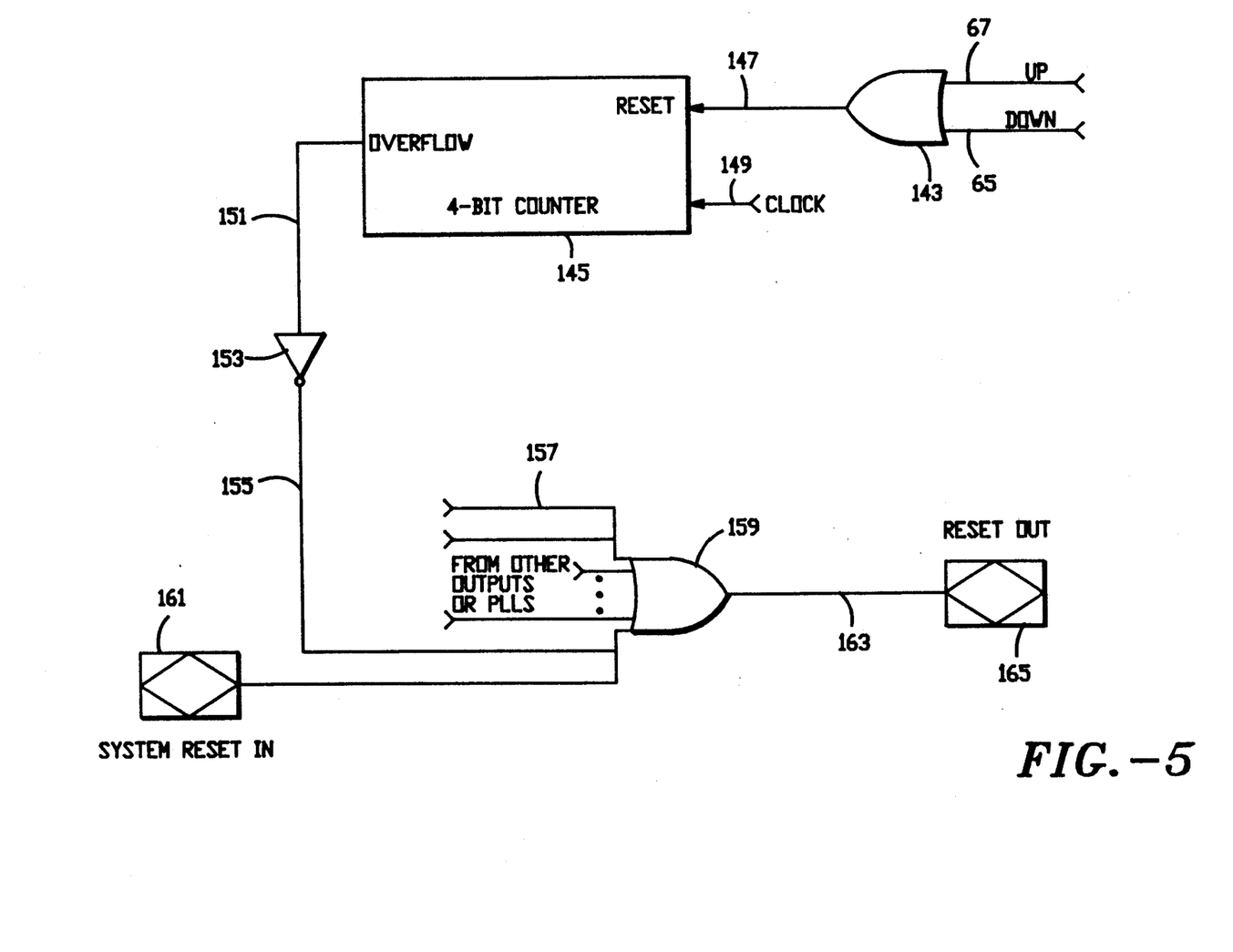
FIG. 5 is a schematic functional block diagram of a reset hold circuit for use by the clock distribution of the present invention.

With reference to FIG. 5, the clock distribution chip for a system preferably includes a circuit that intercepts the system's reset signal on its way to the other circuit elements or chips in the system, and that continues to assert the reset signal as long as the delays on any of the clock paths are still being adjusted. Thus, the system is prevented by this circuit from starting or resuming normal operation until all of the clock delays are properly set. The "down" output 65 and the "up" output 67 from a phase comparator (63 in FIG. 1 or 75 in FIG. 3) are connected, not only to a charge pump (69 in FIG. 1 or 77 in FIG. 3), but also to an OR gate 143. A counter 145, typically a four-bit counter, has a reset input connected to the output 147 of the OR gate 143, another input 149 connected to receive the input clock signal CLOCK and an overflow output 151. The overflow output 151 connects to the input of an inverter 153, which provides an output 155. The inverter output 155, together with other outputs 157 from counters 145 for other phase-locked-loop-like de-skewing circuitry on the clock distribution chip, connect to inputs of a second OR gate 159. The system reset signal is received from a RESET IN terminal 161, and is also connected to an input of OR gate 159. The OR gate 159 produces a RESET OUT signal on an output 163, which is sent through a terminal 165 to reset terminals of other circuit elements or chips in the system.

A de-skewing circuit is assumed to have completed its adjustments when its phase comparator 63 or 75 has not driven the charge pump with an "up" or "down" output 65 or 67 for $2^n$ clock cycles (here 16 clock cycles), where n is the number of bits in the counter 145. Note that when adjustments in the delay by the de-skewing circuitry is still on-going, either the "up" or "down" output 65 or 67 will be logic high, so that the output 147 of OR gate 143 is also logic high, continuously resetting the counter 145 to zero. When adjustments have ceased, both "up" and "down" outputs 65 and 67 will be logic low, so that the output 147 of OR gate 143 is also logic low. Then the counter 145 will increment on each clock cycle until 16 clock cycles have passed, when the overflow output 151 will switch to logic high and the corresponding input 155 to second OR gate 159 will switch to logic low. Only when the system reset signal received on the reset in terminal 161, the inverted overflow signal on input 155 and all of the inverted overflow signals from other de-skewing circuits on inputs 157 have all switched to logic low will the reset output signal on terminal 165 drop to logic low. Thus, only when all necessary de-skewing adjustments have been completed by the clock distribution chip will the system begin normal operation. Further, the clock distribution chip may include output buffers (11 in FIG. 1, 71 and 73 in FIG. 3, 129 a-f in FIG. 4) which are responsive to an output enable control signal derived from the reset output signal, so that the chip only distributes a clock signal to the recipient chips in the system when the particular clock path is being adjusted or after all delays have been set.

I claim:

1. A clock distribution circuit comprising
   a plurality of output drivers connected to receive a clock signal and to distribute said clock signal on a plurality of outward signal paths to a plurality of clock recipients,
   comparison means, connected to receive a return signal on a plurality of inward return paths from said plurality of clock recipients and also connected to receive a reference signal, for comparing the phase of said return signal on each of said return paths with the phase of said reference signal, said inward return paths being parallel to and substantially equal in length to corresponding outward signal paths, and
   delay means, including a plurality of controllable delay elements located on both said outward signal paths and said inward return paths, for adjusting signal delays on said paths in response to a result of said comparing by said comparison means until the phase of said return signal on each inward return path is substantially equal to the phase of said reference signal, said signal delay on each outward signal path being equal to said signal delay on the corresponding inward return path, whereby said clock signal arrives at said plurality of clock recipients with substantially equal phase,
   wherein said comparison means includes a single phase comparator and a single charge pump shared in common with a multiple output drivers, said phase comparator having a pair of inputs connected to receive said return signal and said reference signal, respectively, and having a pair of outputs connected to a corresponding pair of inputs of said charge pump, said comparator providing a pair of digital signals on said pair of outputs representative of whether said return signal leads, lags or is in sync with said reference signal, said charge pump either increasing or decreasing a control voltage on an output thereof in response to said digital signals,
   said comparison means further including a multiplexer with an output connected to an input of said single common phase comparator, with multiple inputs connected to multiple return paths associated with said multiple output drivers and responsive to a selection control signal to select one of said multiple inputs for coupling to said output, and
   said delay means including voltage storage means corresponding to each input driver for receiving and storing a control voltage from said charge pump, said voltage storage means for a particular output driver being active only when the selected input to said multiplexer corresponds to that output driver.

2. A clock distribution circuit comprising
   a plurality of output drivers connected to receive a clock signal and to distribute said clock signal on a plurality of outward signal paths to a plurality of clock recipients,
   comparison means, connected to receive a return signal on a plurality of inward return paths from said plurality of clock recipients and also connected to receive a reference signal, for comparing the phase of said return signal on each of said return paths with the phase of said reference signal, said inward return paths being parallel to and substantially equal in length to corresponding outward signal paths, and
   delay means, including a plurality of controllable delay elements located on both said outward signal paths and said inward return paths, for adjusting signal delays on said paths in response to a result of said comparing by said comparison means until the phase of said return signal on each inward return path is substantially equal to the phase of said reference signal, said signal delay on each outward signal path being equal to said signal delay on the corresponding inward return path, whereby said clock signal arrives at said plurality of clock recipients with substantially equal phase,
   further comprising an input receiver located on each of said return paths, said input receiver having plural input buffers with different logic level transition points, each input buffer having an input connected to said return path, each input buffer also having an output connected to programmable means for selecting one of said input buffers for coupling to said comparison means.

3. The clock distribution circuit of claim 2 wherein a configuration memory bit controls said selecting by said programmable means.

4. A clock distribution circuit comprising
   a plurality of output drivers connected to receive a clock signal and to distribute said clock signal on a plurality of outward signal paths to a plurality of clock recipients,
   comparison means, connected to receive a return signal on a plurality of inward return paths from said plurality of clock recipients and also connected to receive a reference signal, for comparing the phase of said return signal on each of said return paths with the phase of said reference signal, said inward return paths being parallel to and substantially equal in length to corresponding outward signal paths, and delay means, including a plurality of controllable delay elements located on both said outward signal paths and said inward return paths, for adjusting signal delays on said paths in response to a result of said comparing by said comparison means until the phase of said return signal on each inward return path is substantially equal to the phase of said reference signal, said signal delay on each outward signal path being equal to said signal delay on the corresponding inward return path, whereby said clock signal arrives at said plurality of clock recipients with substantially equal phase, further comprising means receiving a system reset signal for providing a reset output signal, said reset output signal being active whenever said system reset signal is active and also whenever said signal delays are still being adjusted by said delay means in response to said result of said comparing by said comparison means.

5. The clock distribution circuit of claim 4 wherein said plurality of output drivers are responsive to a control signal derived from said sheet reset output signal, each output driver distributing said clock signal only when selected by said comparison means and when adjustments of all signal delays have been completed.

6. A clock distribution circuit comprising driver means for providing multiple copies of a clock signal on multiple outputs connected to first conductive traces so as to distribute said clock signal to a plurality of clock recipients, and de-skewing logic means for measuring propagation times of said clock signal along said conductive traces from each output to the corresponding clock recipient and for compensating for differences in said propagation times to ensure that said clock signal arrives at said plurality of clock recipients with substantially equal phase, said de-skewing logic means including (a) means for receiving return signals on multiple inputs connected to second conductive traces from said plurality of clock recipients, each second trace being parallel to and substantially equal in length to a corresponding first trace to which said second trace is connected near a corresponding clock recipient, (b) means for providing a reference clock signal, (c) comparison means with inputs coupled to said receiving means and to said reference clock providing means for comparing the phases of said return signals with respect to the phase of said reference clock signal, and (d) a plurality of voltage-controlled delay elements connected to said driver means and to said return signal receiving means so as to provide time delays to signals on said first and second traces, each pair of delay elements associated with corresponding first and second traces being responsive to a control voltage output from said comparison means as a result of comparing said return signal on said associated second trace, wherein said receiving means includes a plurality of input buffers connected to said second conductive traces and a multiplexer connected between said input buffers and said comparison means, said multiplexer responsive to a selection control signal so as to select one of said input buffers for coupling to said comparison means.

7. The clock distribution circuit of claim 6 wherein a configuration memory bit provides said selection control signal to said multiplexer.

8. A clock distribution circuit comprising driver means for providing multiple copies of a clock signal on multiple outputs connected to first conductive traces so as to distribute said clock signal to a plurality of clock recipients, and de-skewing logic means for measuring propagation times of said clock signal along said conductive traces from each output to the corresponding clock recipient and for compensating for differences in said propagation times to ensure that said clock signal arrives at said plurality of clock recipients with substantially equal phase, said de-skewing logic means including (a) means for receiving return signals on multiple inputs connected to second conductive traces from said plurality of clock recipients, each second trace being parallel to and substantially equal in length to a corresponding first trace to which said second trace is connected near a corresponding clock recipient, (b) means for providing a reference clock signal, (c) comparison means with inputs coupled to said receiving means and to said reference clock providing means for comparing the phases of said return signals with respect to the phase of said reference clock signal, and (d) a plurality of voltage-controlled delay elements connected to said driver means and to said return signal receiving means so as to provide time delays to signals on said first and second traces, each pair of delay elements associated with corresponding first and second traces being responsive to a control voltage output from said comparison means as a result of comparing said return signal on said associated second trace, wherein said comparison means includes a single common phase comparator for multiple driver means and a multiplexer connected to an input of said common phase comparator, said multiplexer having inputs connected to receiving means of plural second conductive traces and having a selection input, said multiplexer responsive to a signal on said selection input to select one of said second conductive traces to be coupled to said common phase comparator.

9. A clock distribution circuit comprising driver means for providing multiple copies of a clock signal on multiple outputs connected to first conductive traces so as to distribute said clock signal to a plurality of clock recipients, and de-skewing logic means for measuring propagation times of said clock signal along said conductive traces from each output to the corresponding clock recipient and for compensating for differences in said propagation times to ensure that said clock signal arrives at said plurality of clock recipients with substantially equal phase, said de-skewing logic means including (a) means for receiving return signals on multiple inputs connected to second conductive traces from said plurality of clock recipients, each second trace being parallel to and substantially equal in length to a corresponding first trace to which said second trace is connected near a corresponding clock recipient, (b) means for providing a reference clock signal,
(c) comparison means with inputs coupled to said receiving means and to said reference clock providing means for comparing the phases of said return signals with respect to the phase of said reference clock signal, and
(d) a plurality of voltage-controlled delay elements connected to said driver means and to said return signal receiving means so as to provide time delays to signals on said first and second traces, each pair of delay elements associated with corresponding first and second traces being responsive to a control voltage output from said comparison means as a result of comparing said return signal on said associated second trace, further comprising means receiving a system reset signal for providing a reset output signal, said reset output signal being active whenever said system reset signal is active and also whenever changes to said control voltage output from said comparison means are still being made as a result of said comparing by said comparison means.

10. The clock distribution circuit of claim 9 wherein said driver means are responsive to a control signal derived from said reset output signal, said driver means associated with each first conductive trace distributing said clock signal only when selected by said de-skewing logic means and when adjustments to said time delays by all said delay elements have been completed.

* * * * *

UNITED STATES PATENT AND TRADEMARK OFFICE
CERTIFICATE OF CORRECTION

PATENT NO. : 5,298,866
DATED : March 29, 1994
INVENTOR(S) : Cecil H. Kaplinsky

It is certified that error appears in the above-indentified patent and that said Letters Patent is hereby corrected as shown below:

Column 2, line 11, the equation "$tpd' = tpd \sqrt{1 + (C_d / C_o)}$" should read -- $tpd' = tpd \sqrt{1 + (C_d / C_o)}$ --.

Claim 2, column 10, line 43, at the end of subparagraph, after the words "equal phase", insert -- and --.

Claim 4, column 11, line 12, at the end of subparagraph, after the words "equal phase", insert -- and --.

Claim 5, column 11, line 22, "said sheet reset" should read -- said reset --.

Claim 9, column 13, line 15, at the end of subparagraph, after the words "second trace,", insert -- and --.

Signed and Sealed this

Ninth Day of August, 1994

Attest:

BRUCE LEHMAN

Attesting Officer

Commissioner of Patents and Trademarks